United States Patent
Joshi et al.

(10) Patent No.: US 6,689,646 B1
(45) Date of Patent: Feb. 10, 2004

(54) PLASMA METHOD FOR FABRICATING OXIDE THIN FILMS

(75) Inventors: Pooran Chandra Joshi, Vancouver, WA (US); John W. Hartzell, Camas, WA (US); Masahiro Adachi, Vancouver, WA (US); Yoshi Ono, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/295,579

(22) Filed: Nov. 14, 2002

(51) Int. Cl.[7] .................... H01L 21/00; H01L 21/84
(52) U.S. Cl. ........................ 438/149; 438/770
(58) Field of Search ........................ 438/149, 150, 438/151, 153, 154, 156, 165, 175, 197, 204, 236, 309, 680, 770

(56) References Cited

U.S. PATENT DOCUMENTS

| | | | |
|---|---|---|---|
| 5,681,418 A | | 10/1997 | Ishimaru ............... 156/345 |
| 5,792,522 A | | 8/1998 | Jin et al. ............... 427/575 |
| 5,858,819 A | * | 1/1999 | Miyasaka ............... 438/149 |
| 6,017,779 A | * | 1/2000 | Miyasaka ............... 438/149 |
| 6,040,022 A | | 3/2000 | Chang et al. ............ 427/579 |
| 6,096,661 A | | 8/2000 | Ngo et al. .............. 438/788 |
| 6,159,559 A | | 12/2000 | Reber et al. ............ 427/579 |
| 6,235,563 B1 | * | 5/2001 | Oka et al. .............. 438/166 |

* cited by examiner

*Primary Examiner*—David Nhu
(74) *Attorney, Agent, or Firm*—David C. Ripma; Matthew D. Rabdau

(57) ABSTRACT

A method is provided for fabricating a thin film oxide. The method include forming a first silicon layer, applying a second silicon layer overlying the first silicon layer, oxidizing the second silicon layer at a temperature of less than 400° C. using an inductively coupled plasma source, and forming a thin film oxide layer overlying the first silicon layer. In some cases, the thin film oxide layer overlies the oxidized second silicon layer and is formed by a high-density plasma enhanced chemical vapor deposition process and an inductively coupled plasma source at a temperature of less than 400° C. In some cases, the thin film oxide layer and the first silicon layer are incorporated into a thin film transistor and the thin film oxide layer has a fixed oxide charge density of $3 \times 10^{11}$ per square centimeter.

24 Claims, 6 Drawing Sheets

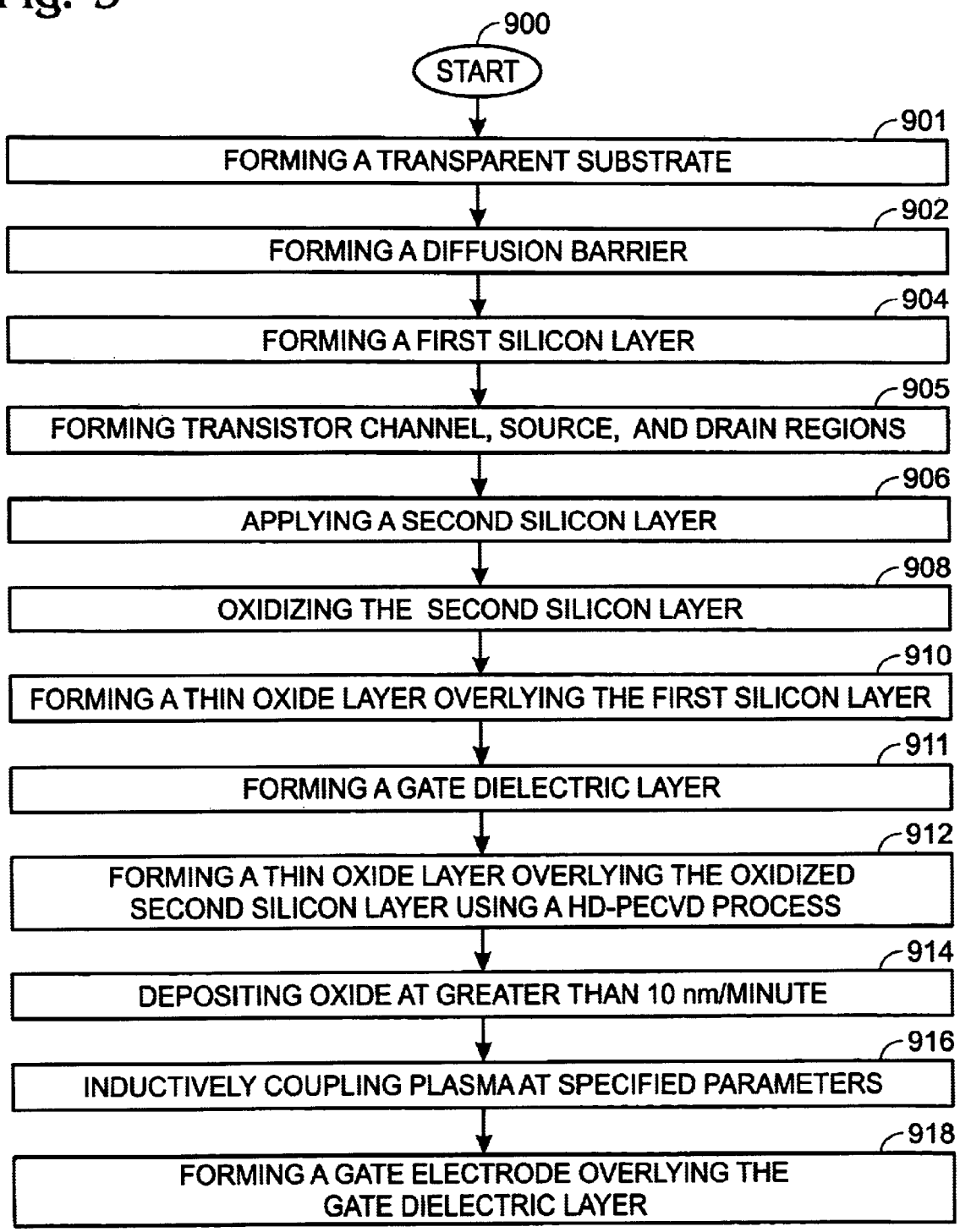

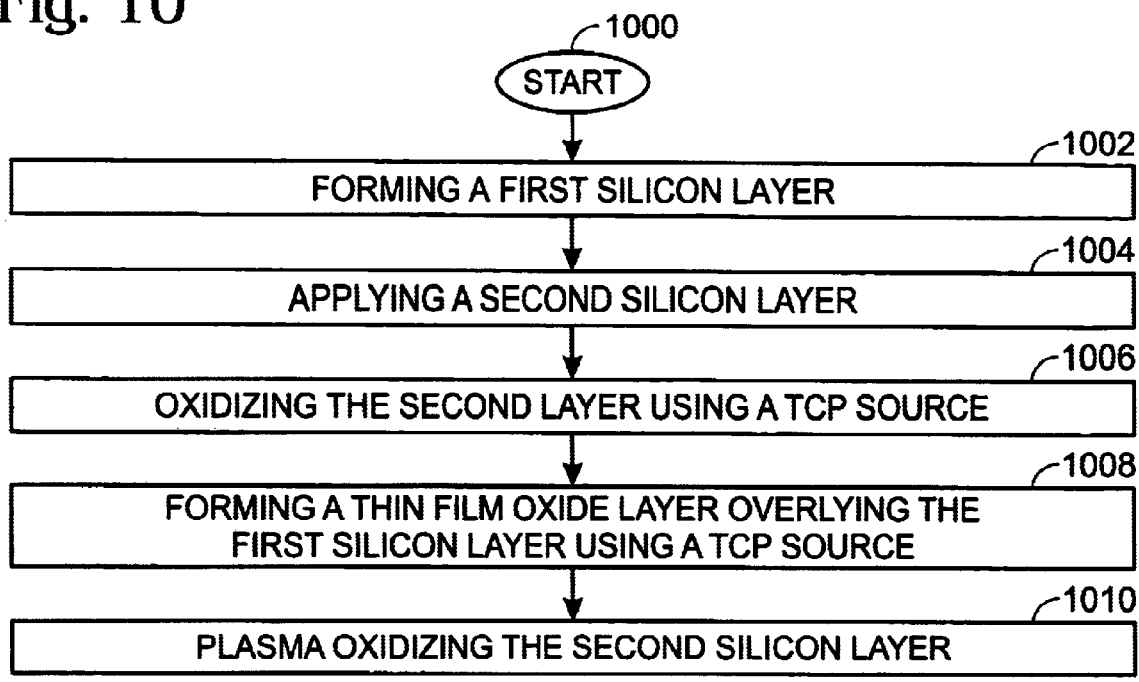
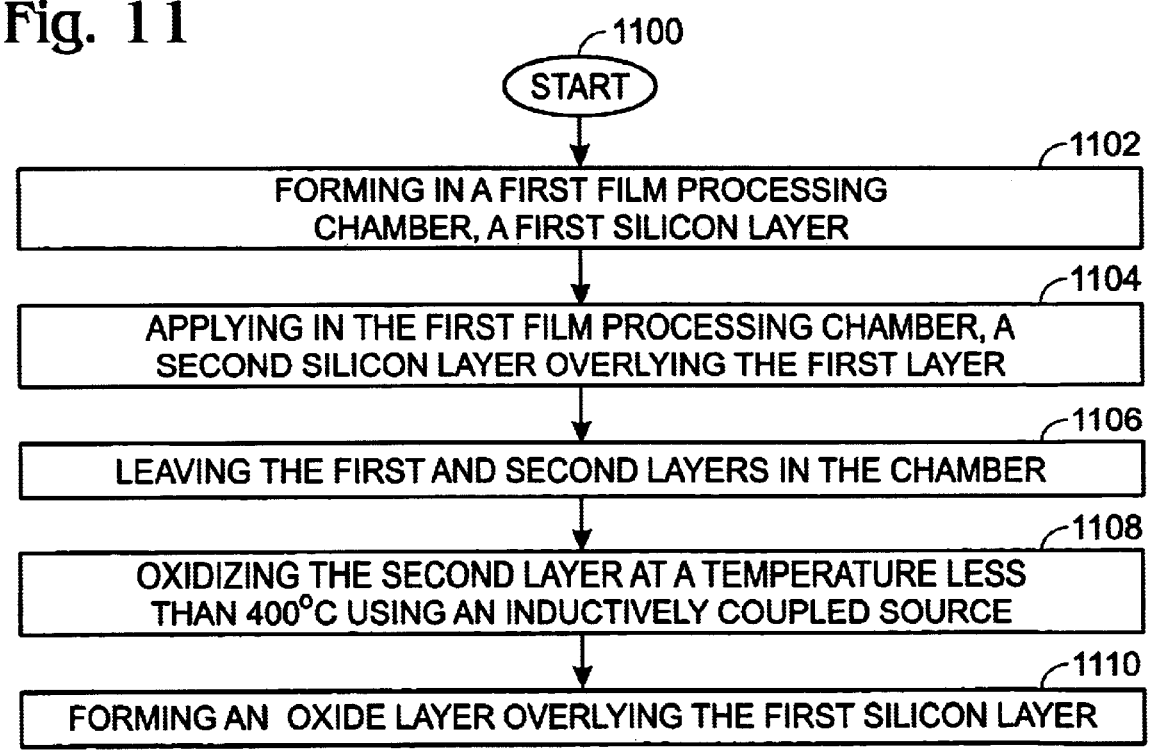

PLASMA METHOD FOR FABRICATING OXIDE THIN FILMS

BACKGROUND OF THE INVENTION

1. Field of the Invention

This invention generally relates to the fabrication of integrated circuit (IC) devices, and more particularly, to a method for forming oxide interfaces on silicon using high-density plasma.

2. Description of the Related Art

FIG. 1 is a schematic of a stacked gate structure for a thin film transistor (prior art). The proper performance of IC devices depends, in part, on the characteristics of oxide layers within the device structure. A thin film transistor (TFT) will be used as an illustration, however, it is understood that the discussion applies to other IC devices as well. In FIG. 1, oxide layers form the gate insulator. Both the bulk characteristics of the gate insulator and the characteristics of the interface between the gate insulator and the silicon layer are very important for the operation of a TFT. For silicon devices, a good gate insulator film is silicon dioxide ($SiO_2$), and a good method of forming a high quality $SiO_2$ film with excellent bulk and interface characteristics is by thermal oxidation. For a TFT, thermal oxidation involves forming a layer of silicon over a diffusion barrier and substrate and heating the resulting stack structure to form a layer of $SiO_2$ overlying the silicon layer. To produce an oxide layer at growth rates rapid enough to be economically practical, thermal oxidation typically is performed at temperatures between 800° C. and 1200° C. Only a limited number of substrate materials, for example, silicon, are compatible with the temperatures required for thermal oxidation.

FIG. 2 is a schematic drawing of a plasma enhanced chemical vapor deposition (PECVD) system (prior art). However, the use of substrate materials incompatible with the temperatures associated with thermal oxidation is of increasing interest. For example, improvements in liquid crystal display (LCD) technology create a need for high performance TFT driver components on transparent substrates such as glass and polymer. Unfortunately, the transparent substrates noted above are incompatible with the temperatures required for thermal oxidation. In fact, it is desirable to process these substrates at temperatures below 400° C. (hereafter referred to as low temperature). Unfortunately, the use of PECVD at low temperature results in higher impurity levels for oxide layers than are typical for thermal oxide or PECVD oxide formed at temperatures greater than 400° C. In addition, low temperature PECVD results in lower oxide deposition rates than are associated with PECVD at temperatures greater than 400° C. For typical low temperature PECVD oxide layers, characteristics such as refractive index, fixed oxide charge density, breakdown field strength, leakage current density, and interface trap density are all inferior to those for typical thermal oxide layers. For example, thermal oxide has a refractive index of 1.46, while low temperature PECVD oxide has a refractive index of less than 1.45. Modifying low temperature PECVD process parameters to increase deposition rates reduces the quality of the bulk and interface characteristics for the resulting oxide. The process in FIG. 2 uses capacitively coupled plasma. The high frequency power is directly connected to the top electrode and capacitively coupled to the bottom electrode. The two electrodes are therefore coupled, and it is not possible to independently control energy directed to the top and bottom electrodes. Therefore, any attempt to enhance the growth rate by increasing the high frequency power leads to an increase in the sheath potential which adversely affects oxide bulk and interface properties.

There are low temperature processes currently under investigation that form an oxide layer overlying a silicon layer. Some of these processes form plasma oxide by converting a portion of the silicon layer to oxide. In some circumstances, it may be convenient to form a plasma oxide layer on a silicon layer while maintain the original thickness of the silicon layer.

It would be advantageous if a low temperature process could form oxide layers with bulk and interface characteristics superior to oxide layers formed by low temperature methods such as PECVD.

It would be advantageous if a low temperature process could form oxide layers with bulk and interface characteristics approaching those for thermal oxide.

It would be advantageous if a low temperature process could deposit oxide at rates greater than those for low temperature methods such as PECVD.

It would be advantageous if a low temperature process could form an oxide layer on a silicon layer while maintaining the original thickness of the silicon layer.

SUMMARY OF THE INVENTION

The present invention method describes a process that yields a thin film oxide, fabricated at temperatures below 400° C., having bulk and interface characteristics approaching those for thermal oxide. The process includes plasma oxidizing a sacrificial silicon layer and uses a high-density inductively coupled plasma source and chemical vapor deposition. The present invention allows the formation of integrated circuit (IC) devices, such as thin film transistors (TFTs), on transparent substrates, such as glass and polymer.

Accordingly, a method is provided for fabricating a thin film oxide. The method comprises forming a first silicon layer, applying a second silicon layer overlying the first silicon layer, oxidizing the second silicon layer at a temperature of less than 400° C. using an inductively coupled plasma source to form an oxide layer overlying the first silicon layer. The second silicon layer is plasma oxidized at a rate of up to approximately 4.4 nanometers (nm) per minute (after one minute). In some aspects of the method, the oxide layer is more than 20 nm thick and has a refractive index between approximately 1.45 and 1.47. The plasma oxide is formed by plasma oxidizing the second silicon layer at specified parameters including power density, pressure, process gas composition, and process gas flow.

In some aspects of the method, the oxide layer overlies the oxidized second silicon layer and is formed at a temperature of less than 400° C. by a high-density plasma enhanced chemical vapor deposition (HD-PECVD) process and an inductively coupled plasma source. In some aspects of the method, the oxide layer and the first silicon layer are incorporated into a TFT by forming a transparent substrate layer, overlying the substrate with a diffusion barrier, and overlying the diffusion barrier with the silicon layer. Then, transistor channel, source, and drain regions are formed in the silicon layer, the oxide layer forms a gate dielectric layer, and a gate electrode overlying the gate dielectric layer is formed. The gate dielectric layer has a fixed oxide charge density of less than $5 \times 10^{11}$ per square centimeter.

Additional details of the above-described method are presented below.

BRIEF DESCRIPTION OF THE DRAWING

FIG. 9 is a flowchart illustrating additional details of the method shown in FIG. 8.

FIG. 10 is a flowchart illustrating the present invention method for fabricating thin films.

FIG. 11 is a flowchart illustrating the present invention method for in-situ fabrication of thin films.

DETAILED DESCRIPTION OF THE PREFERRED EMBODIMENTS

Figure 1:
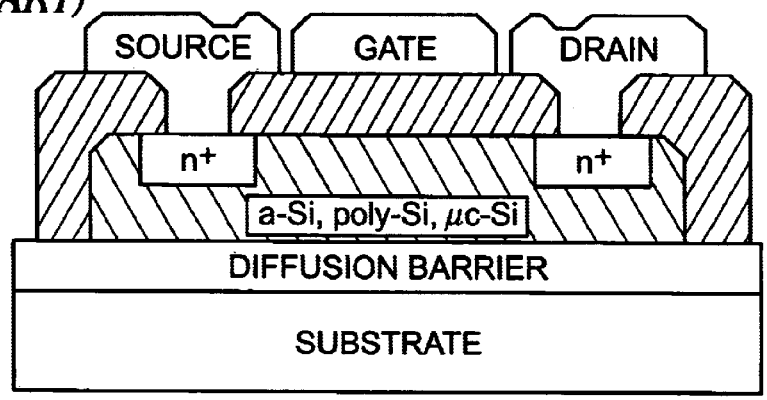
FIG. 1 is a schematic of a stacked gate structure for a thin film transistor (prior art).
Figure 2:
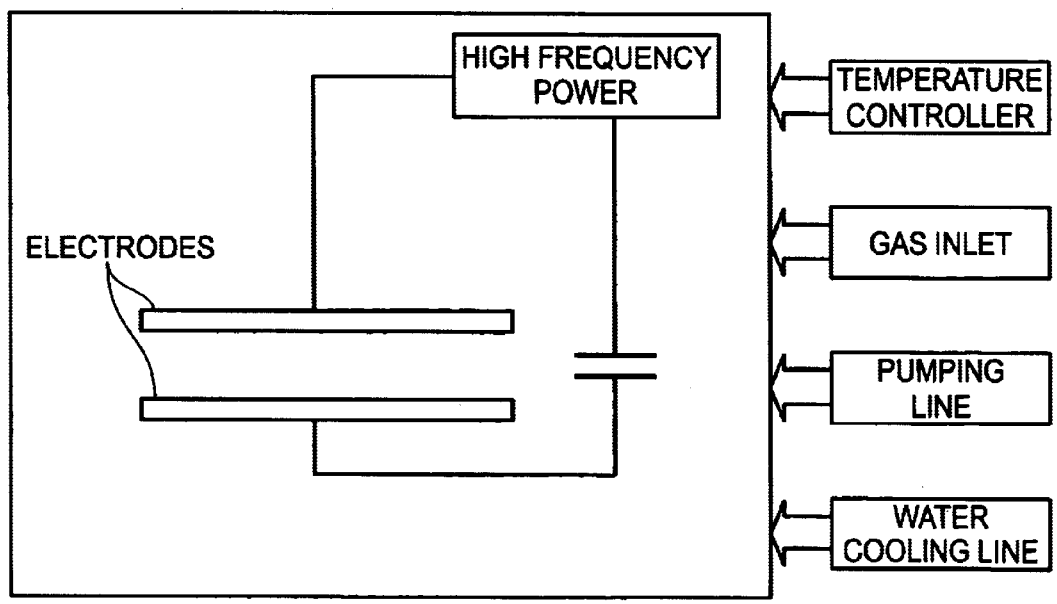
FIG. 2 is a schematic drawing of a plasma enhanced chemical vapor deposition (PECVD) system (prior art).
Figure 3:
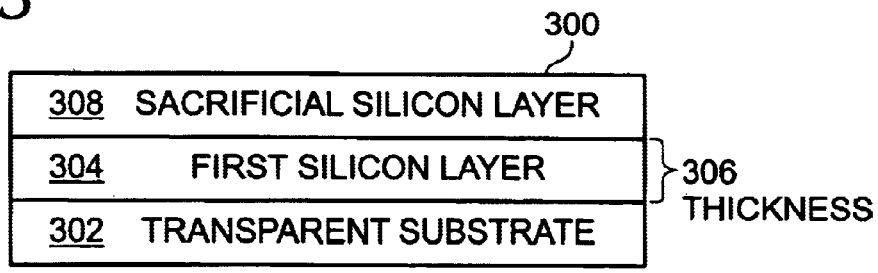
FIG. 3 is a partial cross-sectional view of a stack structure showing a sacrificial silicon layer.

FIG. 3 is a partial cross-sectional view of a stack structure 300 showing a sacrificial silicon layer, FIG. 3 shows a step in a gate stack fabrication process. This process is applicable to the formation of an oxide layer overlying a silicon layer while maintaining the original thickness of the active silicon layer. That is, a process to avoid directly oxidizing an active silicon layer. To accomplish this, a transparent substrate 302 is overlain with a first silicon layer 304 having a thickness 306. Layer 304 is overlain with a second, sacrificial silicon layer 308. The layer 308 is converted to an oxide layer by exposing it to high-density plasma in an oxidizing atmosphere as described below. The plasma oxidation is halted when the sacrificial layer 308 is completely converted to plasma oxide, and before the active silicon layer 304 begins to undergo plasma oxidation. Thus, silicon layer 304 maintains its thickness 306. The transparent substrate 302 can he glass or polymer, but is not limited to these materials. The silicon layer 304 can be selected from the group including amorphous silicon, microcrystalline silicon, and polycrystalline silicon. The sacrificial layer 308 is typically amorphous silicon.

Figure 4:
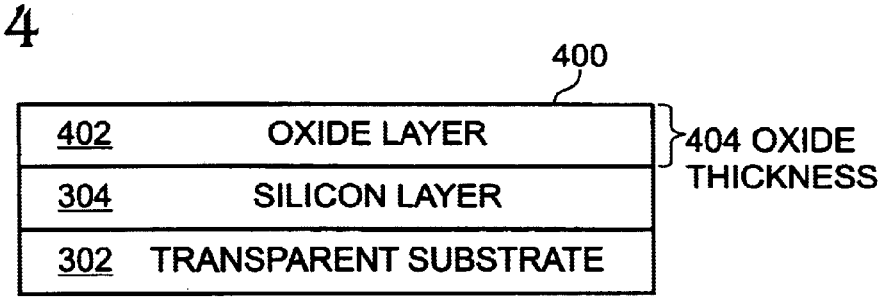
FIG. 4 is a partial cross-sectional view of the stack structure of FIG. 3, following an oxidation process, to form the present invention oxide interface.

FIG. 4 is a partial cross-sectional view of the stack structure of FIG. 3, following an oxidation process, to form the present invention oxide interface 400. An oxide layer 402 with a thickness 404 (formed by the oxidation of the sacrificial layer 308 as described above) overlies the silicon layer 304. A high-density inductively coupled plasma (ICP) source (not shown) is used to form the oxide layer 402 at a temperature less than 400° C. Forming the oxide layer 402 at a temperature less than 400° C. permits the use of the transparent substrate 302, which is incompatible with the temperatures associated with thermal oxidation (800° C. to 1200° C.). In turn, the transparent substrate 302 facilitates the use of the oxide interface 400 in display devices, such as devices with liquid crystal displays (LCDs).

The oxide layer 402 has bulk characteristics approaching those for thermal oxide. Bulk characteristics are inherent to the physical composition of the oxide layer 402, in comparison to interface characteristics that measure the electrical performance of the oxide layer 402, for example, in an IC device. In some aspects of the method, the thickness 404 is more than 20 nanometers (nm). For a thickness 404 greater than 20 nm, the refractive index for the oxide layer 402 typically lies between approximately 1.45 and 1.47. As a comparison, thermal oxide has a refractive index of 1.46. For thickness 404 values less than 20 nm, plasma oxide has interface characteristics (as described below) comparable to thermal oxide, making plasma oxide particularly well suited for use in relatively thin layers.

Figure 5:
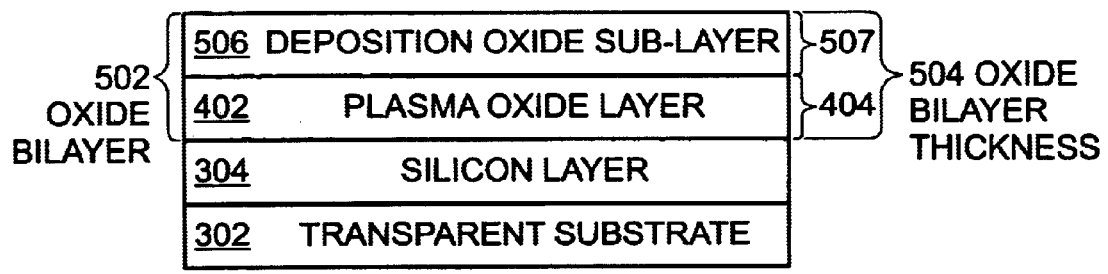
FIG. 5 is a partial cross-sectional view showing the stack structure of FIG. 3, following the formation of an oxide bilayer.
Figure 6:
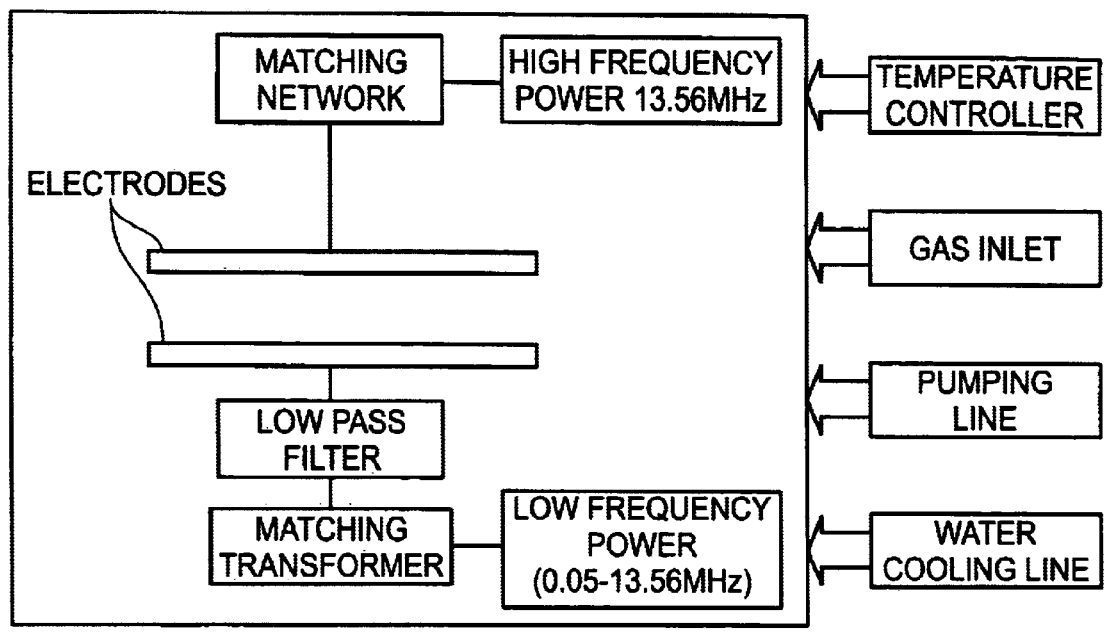
FIG. 6 is a schematic drawing of a high-density plasma enhanced chemical deposition (HD-PECVD) system.
Figure 7:
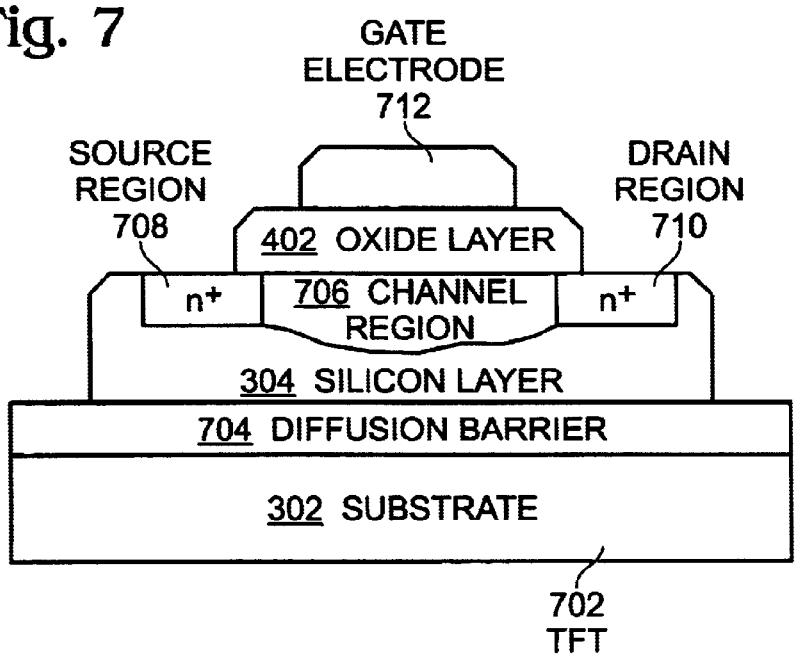
FIG. 7 is a partial cross-sectional view of a thin film transistor (TFT) fabricated using the present invention method.

FIG. 5 is a partial cross-sectional view showing the stack structure of FIG. 3, following the formation of an oxide bilayer. FIG. 6 is a schematic drawing of a high-density plasma enhanced chemical deposition (HD-PECVD) system. FIG. 7 is a partial cross-sectional view of a thin film transistor (TFT) fabricated using the present invention method. In FIG. 5, an oxide bilayer 502 with a thickness 504 overlies the silicon layer 304. The bilayer 502 includes the oxide layer 402 and a deposition oxide sub-layer 506 formed by using the HD-PECVD process shown in FIG. 6. The sub-layer 506 has a thickness 507. The higher plasma density and energy levels associated with the HD-PECVD process allow it to deposit oxides with fewer impurities than those for conventional PECVD processes performed at less than 400° C. Plasma oxide and deposition oxide each have advantages with respect to optimal layer thickness and rate of formation. The plasma oxide layer 402 has better interface characteristics than deposition oxide at thickness less than 20 nm. These interface characteristics are further described below. However, plasma oxide has a slower growth rate (4.4 nm/minute) than deposition oxide (greater than 10 nm/minute). The plasma growth rate of 4.4 nm/minute is the growth rate established one minute after a plasma oxidation process begins. The deposition oxide growth rate of greater than 10 nm/minute is the growth rate established 10 minutes after a HD-PECVD process begins. Therefore, it is preferred to limit the thickness 404 to less than 20 nm. Deposition oxide with its higher growth rate and good bulk and interface characteristics at a thickness above 10 nm is used in the sub-layer 506 to complete the bilayer 502. In some aspects of the invention, the thickness 507 ranges from 10 to 100 nm. For a thickness 507 greater than 20 nm, the refractive index for the sub-layer 506 typically lies between approximately 1.45 and 1.47. In some aspects of the invention, the thickness 504 ranges from 10 to 100 nm. For a thickness 504 greater than 20 nm, the refractive index for the oxide bilayer 502 typically lies between approximately 1.45 and 1.47. The thickness 504 and the thickness 507 are not limited to 100 nm. 100 nm is chosen to illustrate a typical oxide layer thickness for IC devices, for example, the TFT in FIG. 7, incorporating the oxide bilayer 502 and the sub-layer 506.

The oxide layer 402 and the sub-layer 506 include silicon oxide and silicon oxynitride, but are not limited to these materials. For deposition oxides, the type of oxide forming sub-layer 506 is dependent on the precursor gases used in the HD-PECVD process. Silane, tertraethoxy silane, and other silicon-containing compounds are suitable precursors for silicon. Neon, argon, and helium can be used for the inert gas. Oxygen or $N_2O$ can be used for the oxidizing gas. To incorporate nitrogen and fluorine into the sub-layer 506, suitable precursors containing these elements can be used, such as, fluorocarbons and ammonia.

In some aspects, the oxide layer 402 and the sub-layer 506 are formed using a transmission/transformer coupled plasma (TCP) source (not shown). The use of a TCP source results in the same oxide layer 402 and sub-layer 506 bulk and interface characteristics as those associated with the use of an ICP source. However, the TCP source allows the process to be scaled up for larger applications, such as LCDs.

It should be understood that the TFT of FIG. 7 is offered only as one illustration of the invention. In the TFT 702, a diffusion barrier 704 overlies the substrate 302 and underlies the silicon layer 304. The silicon layer 304 includes a channel region 706, a source region 708, and a drain region 710. A gate electrode 712 overlies the oxide layer 402. The oxide layer 402 acts as a gate insulator. Although oxide layer 402 is shown in FIG. 7, it is understood that the oxide bilayer 502 also can be used as the gate insulator.

The interface or electrical characteristics of the oxide layer 402 and the oxide bilayer 502 can be measured within the structure of the TFT 702. In the TFT 702; the oxide layer 402 and the oxide bilayer 502 have the following interface characteristics: a fixed oxide charge density less than $5 \times 10^{11}/cm^2$; an interface trap concentration of approximately $0.9 \times 10^{10}$ to $8 \times 10^{10}$ per square centimeter-electron volt ($/cm^2$ eV); a flat band voltage shift of less than 1 V for a 30 minute bias temperature stress reliability test at: 150° C., ±2 megavolts per centimeter (MV/cm); a leakage current density lower than $10^{-7}$ amperes per square centimeter ($A/cm^2$) at an applied electric field of 8 MV/cm; and, a breakdown field strength greater than 10 MV/cm. For deposition oxide, the interface trap concentration is approximately $2 \times 10^{10}$ to $8 \times 10^{10}/cm^2$ eV. These interface characteristics approach those for thermal oxide. For example, the flat-band voltage shift, leakage current density, and breakdown field strength are approximately of the same order for thermal oxide, plasma oxide, and deposition oxide (at thicknesses greater than approximately 10 nm).

Functional Description

The present invention method plasma oxidizes a sacrificial silicon layer and combines the use of a high-density inductively coupled plasma (HD-ICP) source and a high-density plasma enhanced chemical vapor deposition (HD-PECVD) process, both operating at substrate temperatures below 400° C. The present invention method produce high quality oxide layers at growth rates significantly higher than those for conventional thermal oxides while maintaining the original thickness of silicon layers upon which the oxide layers are formed. The present invention method is an in-situ process forming thin film oxide layers for thin film transistors (TFTs) and other integrated circuit (IC) applications. Processing below 400° C. (hereafter referred to as low temperature) allows the possibility of integration on transparent substrates such as glass and polymer. The present invention uses the HD-PECVD system configuration shown in FIG. 6. The use of the HD-PECVD system configuration allows the electrodes in FIG. 6 to be decoupled, resulting in low self-bias at the substrate. Thus, the HD-PECVD system configuration permits independent control of plasma ion/electron density and energy to enhance both film growth rate and bulk and interface properties. The HD-PECVD system configuration is used for both the plasma oxidation of silicon and the HD-PECVD deposition of $SiO_2$ thin films.

As noted in the Background Section, thermal oxidation produces an oxide with good bulk and interface characteristics. However, thermal $SiO_2$ growth rates are impractical at temperatures below 800° C. The present invention high-density plasma oxidation of a sacrificial silicon layer has shown growth rates significantly higher than those for thermal oxidation. In addition, plasma oxide maintains good characteristics in thin layers (less than 20 nm).

The HD-PECVD process is effective in minimizing impurities incorporated in the films during deposition at low processing temperatures, as well as, impurity related bonds in the films. This is possible because plasma density and energy levels are higher for the HD-PECVD process than those for conventional PECVD processes.

The invention also combines plasma oxide and HD-PECVD oxide into an oxide bilayer as shown in FIG. 5. One application for the oxide bilayer is a low temperature high quality gate oxide stack for TFT devices as shown in FIG. 7. The interface and bulk properties of the gate oxide layer can be significantly enhanced while maintaining the original thickness of the silicon layers in the stacked structures by fabricating stacked structures using a combination of plasma oxidation of a sacrificial silicon layer and HD-PECVD techniques. The plasma oxidation of the sacrificial silicon layer at temperatures below 400° C. using the HD-ICP source makes it possible to enhance the gate interface characteristics while exploiting the high deposition rate of the HD-PECVD process. That is, the invention takes advantage of the properties associated with plasma oxide and HD-PECVD oxide by first plasma oxidizing a sacrificial silicon layer to form a thin plasma oxide layer and then depositing a (generally) thicker HD-PECVD oxide layer. Since the oxidation rate for plasma oxide is relatively low, it is preferred to minimize the thickness of the plasma oxide as necessary to obtain the desirable interface properties. This is typically less than 20 nm. HD-PECVD oxide, with its higher growth rate, is then deposited over the plasma oxide layer. The gate stacked structures fabricated in-situ by using a combination of the plasma oxidation and HD-PECVD processes at substrate temperatures below 400° C. provide significant enhancement in gate oxide quality, compared to those processed by conventional PECVD processes currently being used for TFT and other IC applications. These gate stacked structures also can solve major issues related to integration on low temperature substrates, interface quality, and reliability of gate structures. In addition, for IC device manufacturing, the present invention can significantly reduce the thermal budget and increase device throughput.

Figure 8:
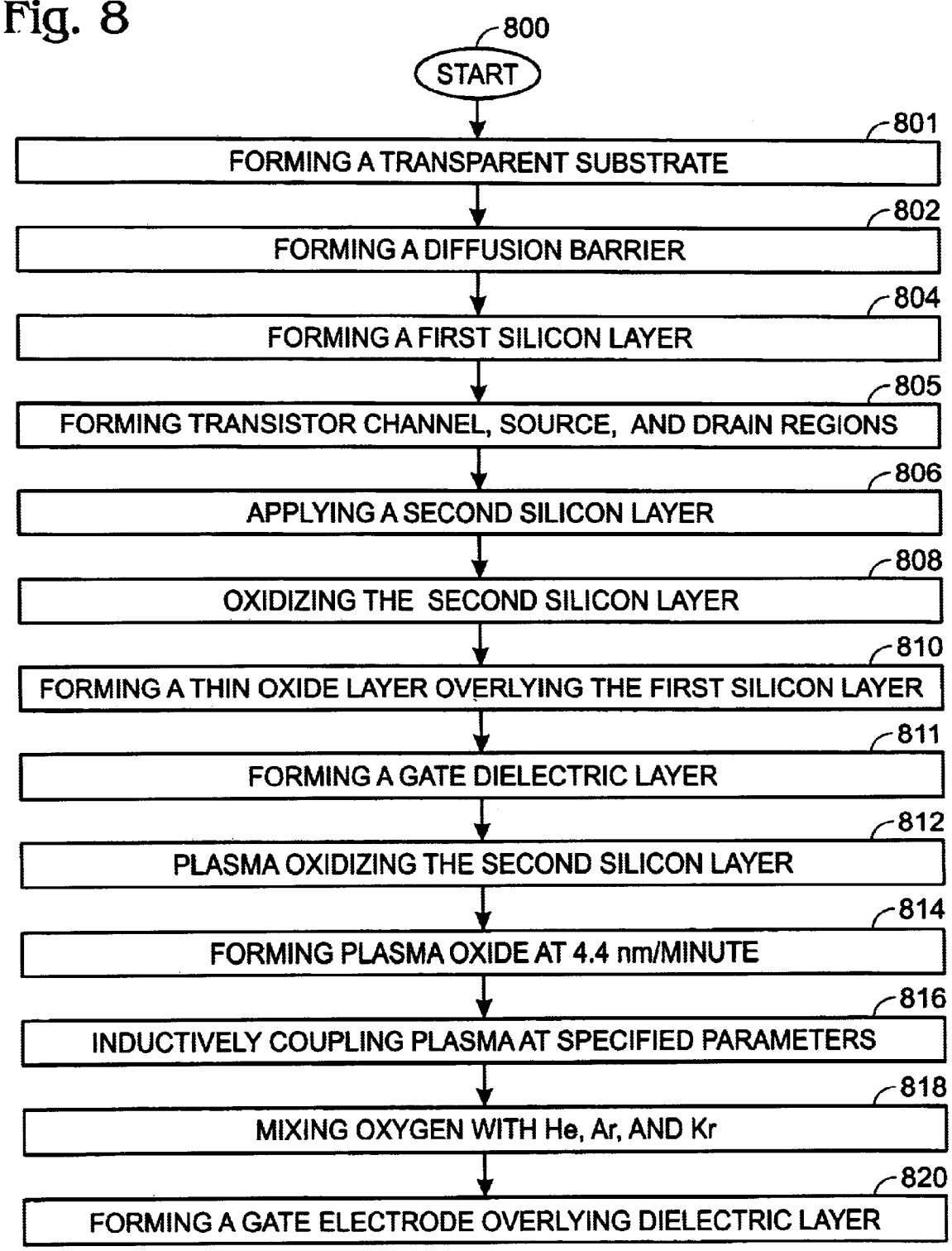
FIG. 8 is a flowchart illustrating the present invention method for fabricating thin films.

FIG. 8 is a flowchart illustrating the present invention method for fabricating a thin film oxide. Although the method in FIG. 8 (and FIGS. 9, 10, and 11 below) is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 800. Step 804 forms a first silicon layer. Step 806 applies a second silicon layer overlying the first silicon layer. Step 808 oxidizes the second silicon layer at a temperature of less than 400° C. using an inductively coupled plasma source. Step 810 forms a thin film oxide layer overlying the first silicon layer. Step 812 plasma oxidizes the second silicon layer. Step 814 forms the plasma oxide at a rate of up to approximately 4.4 nm per minute (after one minute). Step 816 inductively couples plasma: at approximately 13.56 megahertz (MHz) with a power density of approximately 0.1 to 1.6 watts per square centimeter ($W/cm^2$); at a pressure of approximately 15 to 500 milliTorr (mTorr); with a mixture of rare gas and oxygen in a ratio of approximately 20:1 to 200:1; and, with a total gas flow of approximately 50 to 200 standard cubic centimeters per minute (sccm). Step 818 mixes oxygen with rare gas selected from the group including helium, argon, and krypton.

The following describes one possible sequence for forming a TFT using the present invention method. It is understood that other sequences also are possible. In some aspects of the method, Step 801 forms a transparent substrate layer. Then, Step 802 forms a diffusion barrier overlying the substrate layer and underlying the first silicon layer. In some aspects of the method, Step 805, following the forming of a first silicon layer in Step 804, forms transistor channel, source, and drain regions in the first silicon layer. In some aspects of the method, Step 811, following the forming a thin film oxide layer overlying the first silicon layer in Step 810, forms a gate dielectric layer with: a fixed oxide charge density of less than $5 \times 10^{11}$ per square centimeter ($/cm^2$); an interface trap concentration of approximately $0.9 \times 10^{10}$ to $8 \times 10^{10}$ per square centimeter-electron volt ($/cm^2$ eV); a flat band voltage shift of less than 1 V for a 30 minute bias temperature stress reliability test at: 150° C., ±2 megavolts per centimeter (MV/cm); a leakage current density lower than $10^{-7}$ amperes per square centimeter ($A/cm^2$), at an applied electric field of 8 MV/cm; and, a breakdown field strength greater than 10 MV/cm. Then, Step 820 forms a gate electrode overlying the gate dielectric layer.

In some aspects of the method, plasma oxidizing the second silicon layer in Step 812 includes forming an oxide layer more than 20 nanometers (nm) thick and forming the oxide layer with a refractive index between approximately 1.45 and 1.47. In some aspects of the method, plasma oxidizing the second silicon layer in Step 812 includes forming an oxide layer less than 20 nm thick.

In some aspects of the method, forming a first silicon layer in Step 804 includes forming a layer selected from the group including amorphous silicon, microcrystalline silicon, and polycrystalline silicon. In some aspects of the method, applying a second silicon layer overlying the first silicon layer in Step 806 includes applying a layer of silicon which can be deposited in-situ or ex-situ by any suitable technique. In some aspects of the method, oxidizing the second silicon layer at a temperature of less than 400° C. using an inductively coupled plasma source in Step 808 includes forming an oxide selected from the group including silicon oxide and silicon oxynitride.

FIG. 9 is a flowchart further illustrating the method shown in FIG. 8. The method starts at Step 900. Step 904 forms a first silicon layer. Step 906 applies a second silicon layer overlying the first silicon layer. Step 908 oxidizes the second silicon layer: at a temperature of less than 400° C. using an inductively coupled plasma source. Step 910 forms a thin film oxide layer overlying the first silicon layer. Step 912 forms a thin film oxide layer overlying the oxidized second silicon layer using a high-density plasma enhanced chemical vapor deposition (HD-PECVD) process and an inductively coupled plasma source at a temperature of less than 400° C. Step 914 deposits oxide at a rate of up to approximately 10 nm per minute (after 10 minutes). Step 916 inductively couples plasma: at approximately 380° C.; at approximately 13.56 MHz with a power density of approximately 0.2 to 1.6 W/$cm^2$; at a pressure of approximately 50 to 250 mTorr; and, with a mixture of $SiH_4$, $N_2O$, and $N_2$ gases in a ratio of approximately 10:100:50 to 25:100:50.

The following describes one possible sequence for forming a TFT using the present invention method. It is understood that other sequences also are possible. In some aspects of the method, Step 901 forms a transparent substrate layer.

Then, Step 902 forms a diffusion barrier overlying the substrate layer and underlying the first silicon layer. In some aspects of the method, Step 905, following the forming of a first silicon layer in Step 904, forms transistor channel, source, and drain regions in the first silicon layer. In some aspects of the method, Step 911, following the forming a thin film oxide layer overlying the first silicon layer in Step 910, forms a gate dielectric layer with: a fixed oxide charge density of less than $5 \times 10^{11}/cm^2$; an interface trap concentration of approximately $2 \times 10^{10}$ to $8 \times 10^{10}/cm^2$ eV; a flat band voltage shift of less than 1 V for a 30 minute bias temperature stress reliability test at: 150° C., ±2 MV/cm; a leakage current density lower than $10^{-7}$ A/$cm^2$ at an applied electric field of 8 Mv/cm; and, a breakdown field strength greater than 10 MV/m. Then, Step 918 forms a gate electrode overlying the gate dielectric layer.

In some aspects of the method, forming a thin film oxide layer overlying the first silicon layer in Step 910 includes forming a thin film oxide layer approximately 10 to 100 nm thick. In some aspects of the method, using a HD-PECVD process and an inductively coupled plasma source at a temperature of less than 400° C. in Step 912 includes depositing oxide in a layer between approximately 10 and 100 nm thick. In some aspects of the method, using a HD-PECVD process and an inductively coupled plasma source at a temperature of less than 400° C. in Step 912 includes forming an oxide selected from the group including silicon oxide and silicon oxynitride.

FIG. 10 is a flowchart illustrating the present invention method for fabricating a thin film oxide. The method starts with Step 1000. Step 1002 forms a first silicon layer. Step 1004 applies a second silicon layer overlying the first silicon layer. Step 1006 oxidizes the second silicon layer at a temperature of less than 400° C. using a transmission/transformer coupled plasma source. Step 1008 forms a thin film oxide layer overlying the first silicon layer at a temperature of less than 400° C. using a transmission/transformer coupled plasma source. Step 1010 plasma oxidizes the second silicon layer. In some aspects of the method, plasma oxidizing the second silicon layer in Step 1010 includes forming a thin film oxide layer more than 20 nm thick and forming the thin film oxide layer with a refractive index between approximately 1.45 and 1.47.

FIG. 11 is a flowchart illustrating the present invention method for in-situ fabrication of thin films. The method starts at Step 1100. Step 1102 forms, in a first film processing chamber, a first silicon layer. Step 1104 applies, in the first film processing chamber, a second silicon layer overlying the first silicon layer. Step 1106 leaves the first and second silicon layers in the first film processing chamber. Step 1108 oxidizes the second silicon layer at a temperature of less than 400° C. using an inductively coupled plasma source. Step 1110 forms an oxide layer overlying the first silicon layer. It should be understood that the above-mentioned steps, associated with the first film processing chamber, are intended to describe in-situ processes.

A method to fabricate a thin film oxide has been provided. The present invention method has been presented using a transparent substrate. However, use of the present invention is not limited to transparent substrates. The present invention can be used on any substrate compatible with temperatures of approximately 400° C. In addition, the present invention can be used to form oxide layers in other applications, such as forming a diffusion barrier for a TFT or other IC device. Examples have been provided of some material thicknesses and of some configurations, such as a TFT. Likewise, some process specifics have been given to clearly explain the fundamental concepts. However, the present invention is not limited to just those thickness, configurations, and specifics. Other variations and embodiments of the present invention will occur to those skilled in the art.

Although the invention has been described with reference to particular embodiments, the description is only an example of the invention's application and should not be taken as a limitation. Consequently, various adaptations and combinations of features of the embodiments disclosed are within the scope of the invention as encompassed by the following claims.

We claim:

1. A method for fabricating a thin film oxide, the method comprising:

forming a first silicon layer;

applying a second silicon layer overlying the first silicon layer;

oxidizing the second silicon layer at a temperature of less than 400° C. using an inductively coupled plasma source; and, forming an oxide layer overlying the first silicon layer.

2. The method of claim 1 wherein oxidizing the second silicon layer at a temperature of less than 400° C. using an inductively coupled plasma source includes plasma oxidizing the second silicon layer.

3. The method of claim 2 wherein plasma oxidizing the second silicon layer includes:

forming an oxide layer more than 20 nanometers (nm) thick; and, forming the oxide layer with a refractive index between approximately 1.45 and 1.47.

4. The method of claim 2 wherein plasma oxidizing the second silicon layer includes forming oxide at a rate of up to approximately 4.4 nm per minute.

5. The method of claim 4 wherein plasma oxidizing the second silicon layer includes forming an oxide layer less than 20 nm thick.

6. The method of claim 4 wherein plasma oxidizing the second silicon layer includes inductively coupling plasma:

at approximately 13.56 megahertz (MHz) with a power density of approximately 0.1 to 1.6 watts per square centimeter ($W/cm^2$);

at a pressure of approximately 15 to 500 milliTorr (mTorr);

with a mixture of rare gas and oxygen in a ratio of approximately 20:1 to 200:1; and, with a total gas flow of approximately 50 to 200 standard cubic centimeters per minute (sccm).

7. The method of claim 6 wherein inductively coupling plasma with a mixture of rare gas and oxygen includes mixing oxygen with rare gas selected from the group including helium, argon, and krypton.

8. The method of claim 7 further comprising:

forming a transparent substrate layer; and forming a diffusion barrier overlying the substrate layer and underlying the silicon layer; and, wherein forming a first silicon layer includes forming transistor channel, source, and drain regions in the first silicon layer; and, wherein forming an oxide layer overlying the first silicon layer includes forming a gate dielectric layer; and, the method further comprising:

forming a gate electrode overlying the gate dielectric layer.

9. The method of claim 8 wherein forming a gate dielectric layer includes forming a layer with:

a fixed oxide charge density of less than $5 \times 10^{11}$ per square centimeter ($/cm^2$);

an interface trap concentration of approximately $0.9 \times 10^{10}$ to $8 \times 10^{10}$ per square centimeter-electron volt ($/cm^2$ eV);

a flat band voltage shift of less than 1 V for a 30 minute bias temperature stress reliability test at: 150° C., ±2 megavolts per centimeter (Mv/cm);

a leakage current density lower than $10^{-7}$ amperes per square centimeter ($A/cm^2$) at an applied electric field of 8 MV/cm; and, a breakdown field strength greater than 10 MV/cm.

10. The method of claim 1 wherein fort an oxide layer overlying the first silicon layer includes forming the oxide layer:

overlying the oxidized second silicon layer; and, using a high-density plasma enhanced chemical vapor deposition (HD-PECVD) process and an inductively coupled plasma source at a temperature of less than 400° C.

11. The method of claim 10 wherein using a HD-PECVD process and an inductively coupled plasma source at a temperature of less than 400° C. includes depositing oxide at a rate of greater than approximately 10 nm per minute.

12. The method of claim 11 wherein using a HD-PECVD process and an inductively coupled plasma source at a temperature of less than 400° C. includes depositing oxide in a layer between approximately 10 and 100 nm thick.

13. The method of claim 11 wherein forming an oxide layer overlying the first silicon layer includes forming an oxide layer approximately 10 to 100 nm thick.

14. The method of claim 11 wherein using a HD-PECVD process and an inductively coupled plasma source at a temperature of less than 400° C. includes inductively coupling plasma:

at approximately 380° C.;

at approximately 13.56 MHz with a power density of approximately 0.2 to 1.6 $W/cm^2$;

at a pressure of approximately 50 to 250 mTorr; and, with a mixture of $SiH_4$, $N_2O$, and $N_2$ gases in a ratio of approximately 10:100:50 to 25:100:50.

15. The method of claim 14 further comprising:

forming a transparent substrate layer; and, forming a diffusion barrier overlying the substrate layer and underlying the silicon layer; and, wherein forming a &8t silicon layer includes forming transistor channel, source, and drain regions in the first silicon layer; and, wherein forming an oxide layer overlying the first silicon layer includes forming a gate dielectric layer; and, the method further comprising:

forming a gate electrode overlying the gate dielectric layer.

16. The method of claim 15 wherein forming a gate dielectric layer includes forming a layer with:

a fixed oxide charge density of less than $5 \times 10^{11}/cm^2$;

an interface trap concentration of approximately $0.9 \times 10^{10}$ to $8 \times 10^{10}/cm^2$ eV;

a flat band voltage shift of less than 1 V for a 30 minute bias temperature stress reliability test at: 150° C., ±2 MV/cm;

a leakage current density lower than $10^{-7}$ A/cm$^2$ at an applied electric field of 8 MV/cm; and, a breakdown field strength greater than 10 MV/cm.

17. The method of claim 1 wherein forming a first silicon layer includes forming a layer selected from the group including amorphous silicon, microcrystalline silicon, and polycrystalline silicon.

18. The method of claim 1 wherein applying a second silicon layer overlying the first silicon layer includes applying a layer of amorphous silicon.

19. The method of claim 1 wherein oxidizing the second silicon layer at a temperature of less than 400° C. using an inductively coupled plasma source includes forming an oxide selected from the group including silicon oxide and silicon oxynitride.

20. The method of claim 10 wherein using a HD-PECVD process and an inductively coupled plasma source at a temperature of less than 400° C. includes forming an oxide selected from the group including silicon oxide and silicon oxynitride.

21. A method for fabricating a thin film oxide, the method comprising:

forming a first silicon layer;

applying a second silicon layer overlying the first silicon layer;

oxidizing the second silicon layer at a temperature of loss than 400° C. using a transmission/transformer coupled plasma source; and, forming an oxide layer overlying the first silicon layer at a temperature of less than 400° C. using a transmission/transformer coupled plasma source.

22. The method of claim 21 wherein oxidizing the second silicon layer at a temperature of less than 400° C. using a transmission/transformer coupled plasma source includes plasma oxidizing the second silicon layer.

23. The method of claim 22 wherein plasma oxidizing the second silicon layer includes:

forming an oxide interface layer more than 20 nanometers (nm) thick; and, forming the oxide interface layer with a refractive index between approximately 1.45 and 1.47.

24. A method for the in-situ fabrication of thin film oxides, the method comprising:

in a first film processing chamber:
forming a first silicon layer; and,
overlying the first silicon layer, applying a second silicon layer; and, leaving the first and second silicon layers in the first film processing chamber:
oxidizing the second silicon layer at a temperature of less than 400° C. using an inductively coupled plasma source; and forming an oxide layer overlying the first silicon layer.

* * * * *